(12) United States Patent
Groen (10) Patent No.: US 6,437,599 B1
(45) Date of Patent: Aug. 20, 2002

(54) PROGRAMMABLE LINE DRIVER

(75) Inventor: Eric Groen, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/706,904

(22) Filed: Nov. 6, 2000

(51) Int. Cl.$^7$ ............... H03K 19/0175; H03K 19/003
(52) U.S. Cl. ............... 326/63; 326/30; 326/82
(58) Field of Search ............ 326/30, 63, 68–69, 326/73, 80–83, 86–87

(56) References Cited

U.S. PATENT DOCUMENTS

| | | | |
|---|---|---|---|
| 6,054,874 A | * | 4/2000 | Sculley et al. ............... 326/83 |
| 6,218,858 B1 | * | 4/2001 | Menon et al. ............... 326/39 |
| 6,222,388 B1 | * | 4/2001 | Bridgewater, Jr. ............ 326/86 |
| 6,313,662 B1 | * | 11/2001 | Ide ............................ 326/83 |

* cited by examiner

*Primary Examiner*—Michael Tokar
*Assistant Examiner*—James H Cho
(74) *Attorney, Agent, or Firm*—Fogg Slifer Polglaze; H. C. Chan (57) ABSTRACT

An integrated circuit output driver has been described. The driver can operate in a mode selected from a group of possible modes. The described driver can operate in either a positive emitter coupled logic (PECL), a current mode logic (CML), a grounded low voltage differential signal (GLVDS), or a low voltage differential signal (LVDS) mode. The driver circuit includes a output driver, an emphasis circuit and termination circuitry. A driver bias circuit controls the bias currents for the output driver and the emphasis circuit. The driver bias circuit is controlled to select the desire driver mode. A termination circuitry can be activated based upon the selected mode.

31 Claims, 5 Drawing Sheets

PROGRAMMABLE LINE DRIVER

TECHNICAL FIELD OF THE INVENTION

The present invention relates generally to output drivers and in particular the present invention relates to a programmable output driver circuit.

BACKGROUND OF THE INVENTION

A variety of concepts for digital logic circuits and digital signaling between circuits are known. Early concepts include DTL (Diode-Transistor Logic), TTL (Transistor-Transistor Logic) and ECL (Emitter Coupled Logic). These modes are used within digital logic circuits as well as for digital signaling between circuits or circuit boards.

Concepts designed for transmission of digital data with a high data rate preferably employ differential transmission and reception of digital data, using a pair of signaling wires. Each of these driver circuits only support one mode of operation, such as positive emitter coupled logic (PECL), current mode logic (CML), grounded low voltage differential signal (GLVDS), and low voltage differential signal (LVDS) modes.

Typically, a circuit is designed to operate using one of these data transmission modes. That is, output driver circuits are provided as part of an integrated circuit to communicate with external circuitry. These driver circuits are typically capable of operating in one communication environment only. For example, if a circuit were designed to operate in a PECL mode, it would have to be redesigned to drive data in GLVDS mode.

For the reasons stated above, and for other reasons stated below which will become apparent to those skilled in the art upon reading and understanding the present specification, there is a need in the art for a driver circuit that can select from numerous possible data communication operating modes. cl SUMMARY OF THE INVENTION The above-mentioned problems with output drivers and other problems are addressed by the present invention and will be understood by reading and studying the following specification.

In one embodiment, an integrated circuit comprises a control circuit to select a data communication mode, and a differential output driver circuit adapted to drive data on first and second external connections based on a selected data communication mode. The selected data communication mode can be selected from the group comprising PECL, LVDS, GLVDS, and CML.

In another embodiment, an output driver circuit comprises a first pull-up transistor coupled in series with a first pull-down transistor between a pull-up bias node and a pull-down bias node. Gates of the first pull-up and first pull-down transistors are coupled to receive a first input data signal, and a common node between the first pull-up and first pull-down transistors is coupled to a first output data node. A second pull-up transistor is coupled in series with a second pull-down transistor between the pull-up bias node and the pull-down bias node. Gates of the second pull-up and second pull-down transistors are coupled to receive a second input data signal, and a common node between the second pull-up and second pull-down transistors is coupled to a second output data node. A control circuit is coupled to provide a pull-up bias current to the pull-up bias node, and provide a pull-down bias current to the pull-down bias node. The bias currents are selected based upon a data communication mode selected from PECL, LVDS, GLVDS, and CML.

A method of outputting data from a output driver circuit is provided. The method comprises selecting a data communication mode from a group comprising PECL, LVDS, GLVDS or CML, and providing bias currents to the output driver circuit based upon the selected data communication mode.

DETAILED DESCRIPTION OF THE INVENTION

In the following detailed description of the preferred embodiments, reference is made to the accompanying drawings that form a part hereof, and in which is shown, by way of illustration, specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Because current high-speed interfaces use different modes, the present invention provides a driver circuit that can select an operating mode. That is, the present invention provides a driver that can be easily adapted to different applications. For example, the driver can be configured to function as any current source, current sink or differential driver.

Figure 1:
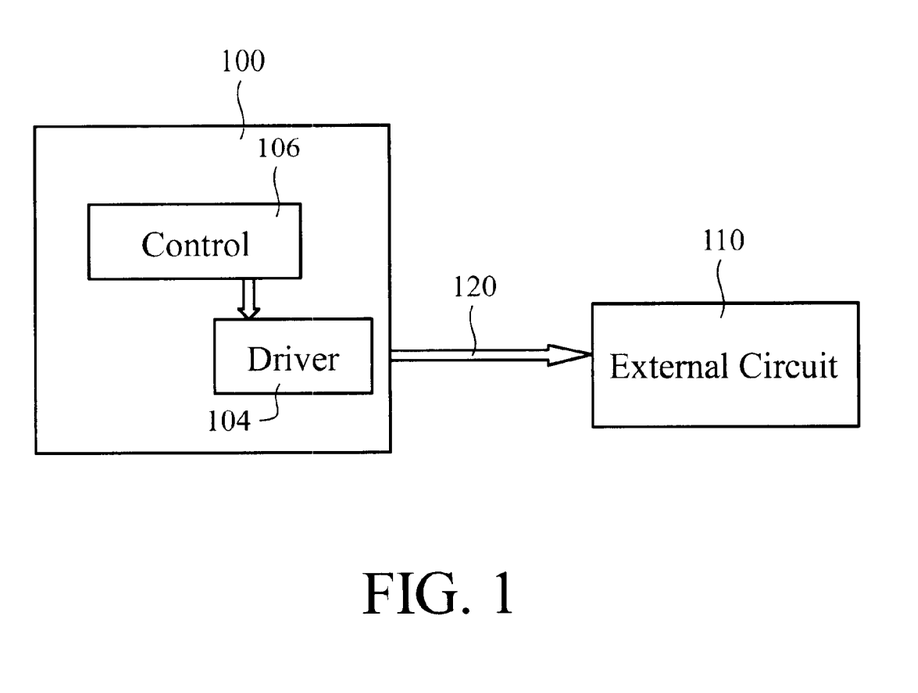
FIG. 1 is a block diagram of an integrated circuit of the present invention.

FIG. 1 illustrates an integrated circuit 100 of the present invention that can be coupled to an external circuit 110 via a communication bus 120. The integrated circuit includes an adjustable output driver circuit 104. The driver circuit 104 can receive input signals from control circuit 106 to select between one of a group of data communication modes. As a result, the present invention allows an integrated circuit to be designed and manufactured to operate in multiple communication environments.

Figure 2:
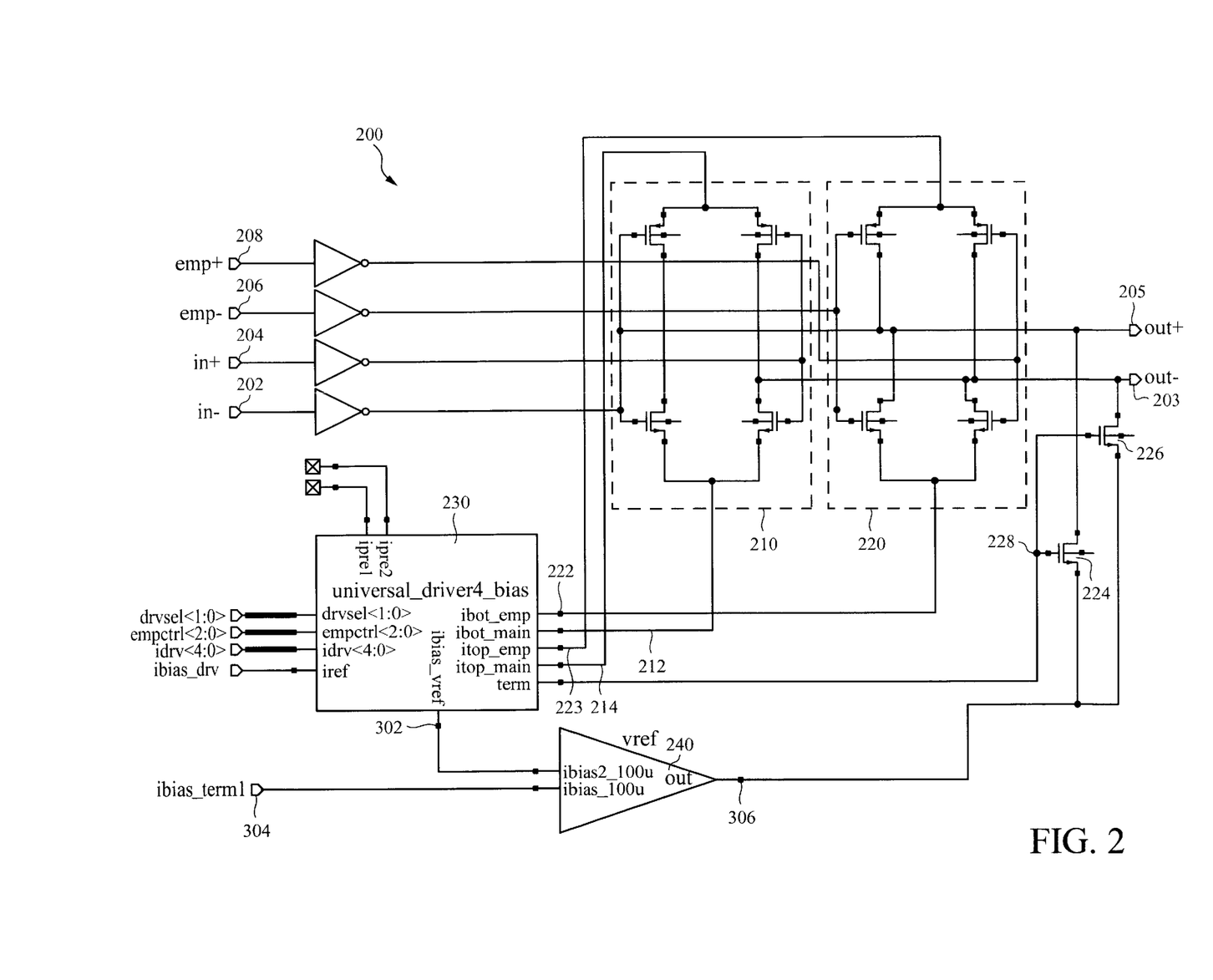
FIG. 2 is a block diagram of an adjustable driver circuit of the present invention.

Referring to FIG. 2, an adjustable driver circuit 200 of the present invention is described. The driver circuit has input data signal connections IN−202 and IN+204. Data is driven on output connections OUT−203 and OUT+205. Pre-emphasis signals EMP− and EMP+ are coupled to input connections 206 and 208, respectively. The driver circuit 200 includes a main driver circuit 210 and an emphasis circuit 220. A bias driver circuit 230 controls bias currents for the main driver circuit 210 and the emphasis circuit 220. An example embodiment of the bias driver circuit 230 is provided below. In general, the bias driver provides top and bottom current bias (nodes 214 and 212, respective) for the main driver circuit. The bias driver also provides top and bottom current bias (nodes 222 and 223, respective) for the emphasis circuit. The emphasis circuitry is used to increase a signal size for high frequency data to somewhat compensate for high-frequency loss common in long copper cable, PC boards, or even long fiber lengths.

Termination resistances are coupled to the output nodes. In one embodiment, the termination resistances are provided using a pair of termination transistors 224 and 226 that are respectively coupled between the output nodes 205 and 203 and a reference voltage, Vref, to provided by reference voltage circuit 240. As explained below, the driver bias circuit 230 selectively activates the termination transistors using a termination signal provided on via node 228. During operation, the driver bias circuit 230 and a reference voltage circuit 240 operate the driver in one of several different operating modes, such as, but not limited to, PECL, CML, LVDS or GLVDS. The present invention can be adjusted using the reference voltage and the bias current, as explained below, to operate in different operating modes.

The voltage reference circuit 240 provides a reference voltage signal that sets a common mode, or average, output voltage signal used for an LVDS mode. Transistors 224 and 226 are coupled to the OUT+ and OUT− connections, 205 and 203. When these transistors are activated by the driver bias circuit termination signal, a termination resistance is provided from the reference voltage circuit to the output connections. In one embodiment, the transistors provide a 50-ohm resistance from the reference voltage circuit to the output connections. Thus, switching these transistors ON enables a 50-ohm termination to Vref, while turning them OFF disables the termination.

The driver bias circuit 230 provides a current bias to the driver circuit 210 and the emphasis circuit 220. The driver circuit bias currents depend on the driver operation mode selected. Likewise, the emphasis circuit also receives a bias currents based upon the selected operating mode.

Table 1 illustrates the driver circuit bias current for different driver configurations. The driver bias circuit determines the current level of bias. In one embodiment, described below, the driver bias circuit has a digital-to-analog (DAC) circuit that sets the Ibias level. The present driver can be adjusted by simply setting a digital input to the DAC. Other techniques are contemplated for adjusting the required currents. Those skilled in the art, with the benefit of the present description, will appreciate that the present invention is not limited to DACs. Further, the bias current can be adjusted based on driver modes other than those listed in Table 1.

TABLE 1

| Mode | PMOS Bias (Itop main) | NMOS Bias (Ibottom main) |
|---|---|---|
| CML | Open circuit (Tri-state) | Ibias |
| PECL | Ibias | Open circuit (Tri-state) |
| LVDS | Ibias | Ibias |
| GLVDS | Ibias | Short circuit |

Table 2 illustrates the emphasis transistor bias current for different driver configurations. The driver bias circuit determines the current level of the emphasis bias. In one embodiment, described below, the driver bias circuit has a digital-to-analog (DAC) circuit that sets the emphasis bias level. The emphasis percent (emp%) is an adjustable control signal to establish an amount of pre-emphasis desired. Emp% can be adjustable by using a second DAC, as explained below.

TABLE 2

| Mode | PMOS Bias (Itop emp) | NMOS Bias (Ibottom emp) |
|---|---|---|
| CML | Open circuit (Tri-state) | Ibias*emp % |
| PECL | Ibias*emp % | Open circuit (Tri-state) |
| LVDS | Ibias*emp % | Ibias*emp % |
| GLVDS | Ibias*emp % | Short circuit |

Given these two currents, the driver circuit 210 and emphasis circuit 220 steer the current through the load one direction, and then switch to steer the current through the load in the other direction. This current multiplied by the driver load determines the output voltage levels. Example single ended peak-to-peak voltages for each communication mode are: CML 0.75V, PECL 0.75V, LVDS 0.325V, and GLVDS 0.325V.

Figure 3:
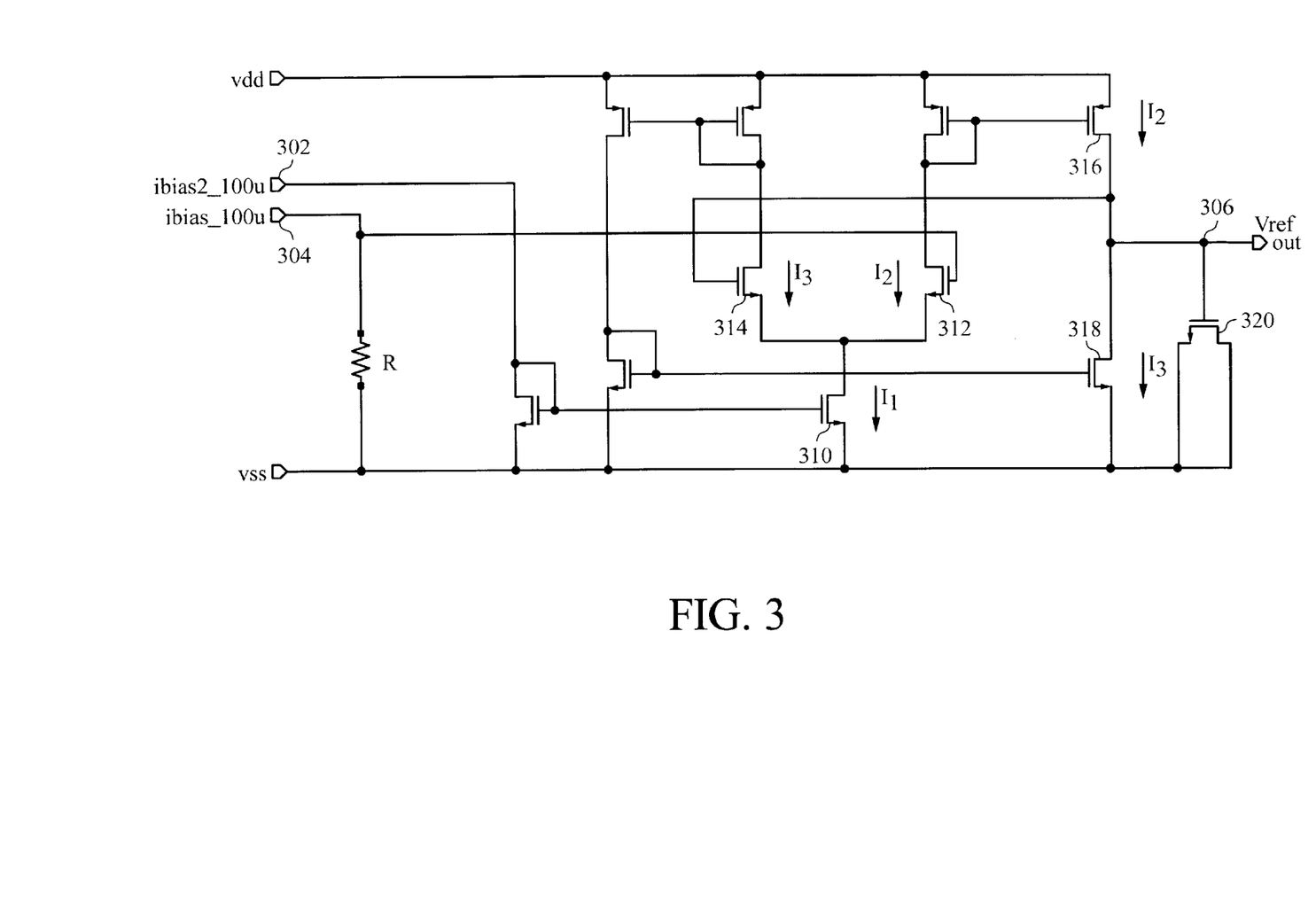
FIG. 3 illustrates one embodiment of a voltage reference circuit of the present invention.

FIG. 3 illustrates one embodiment of a voltage reference circuit 240. It will be appreciated by those skilled in the art with the benefit of the present invention that the voltage reference circuit can be implemented in a number of different ways and the present invention is not limited to the circuit of FIG. 3. In operation, Ibias 1 coupled at node 302 is provided from the driver bias circuit. A second bias current, Ibias 2, is coupled to node 304. These two bias currents establish a voltage level of Vref at output node 306. Ibias 1 controls a current through n-channel transistor 310 (I1), and Ibias 2 determines the current conducted through transistor 312 (I2). As such, a current conducted through transistor 314 (I3) equals I1−I2. The current through transistor 312 is mirrored to transistor 316 and the current through transistor 314 is mirrored through transistor 318. As such, currents I1 and I2 are balanced. By negative feedback, the output Vref is set to the voltage Ibias2*R. The circuit acts as a buffer for the reference and provides current drive capability to the voltage reference.

Figure 4:
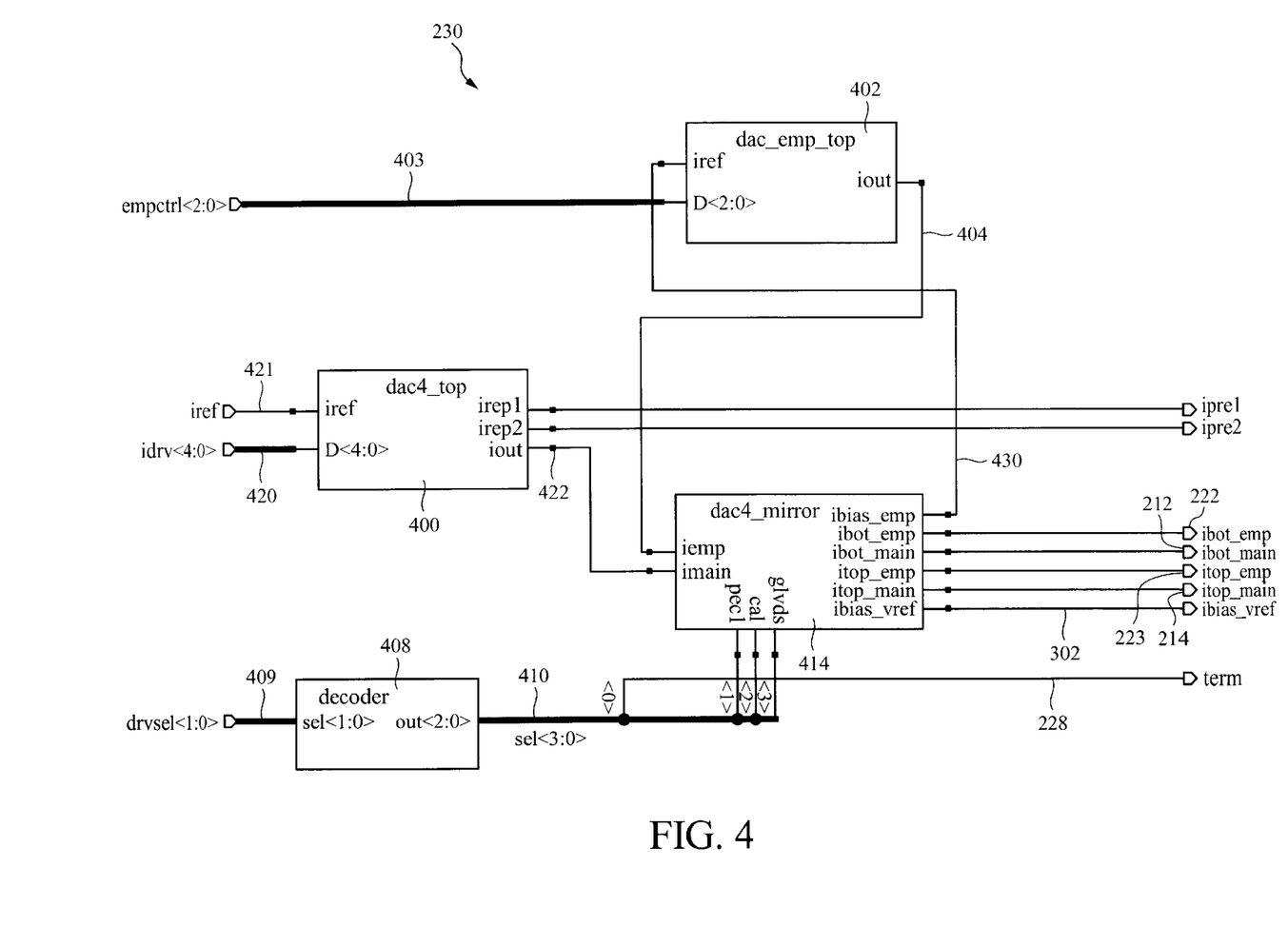
FIG. 4 is a more detailed block level description of one embodiment of a driver bias circuit.

Referring to FIG. 4, a more detailed block level description of one embodiment of the driver bias circuit 230 is explained. The driver bias circuit of this embodiment includes a 5-bit digital-to analog converter (DAC) 400 to control the main driver current (imain), a 3-bit DAC 402 is provided to control the emphasis percentage (iemp), a 2:4 digital decoder 408 decodes the mode selection (either PECL, CML or GLVDS), and a main bias mirror and control block 414 provides the driver circuit and emphasis circuit bias currents.

In operation, 5-bit DAC 400 establishes a main bias current on node 422 in response to control signals on bus 420 and a reference current input 421. Thus, the main reference current can be established using a digital code on bus 420. The 3-bit DAC 402 establishes the emphasis percentage on node 404 by decoding a digital input code on bus 403. The emphasis percent, therefore, is controlled by a supplied code. Likewise, decoder 408 receives a digital code on bus 409 that indicates a desired driver operating mode. The decoder then instructs main bias mirror and control block 414, via bus 410, of the desired operating mode. The main bias mirror and control block 414 then establishes the driver circuit and emphasis circuit bias levels. Decoder circuit 408 provides a termination signal to control the termination transistors.

Figure 5:
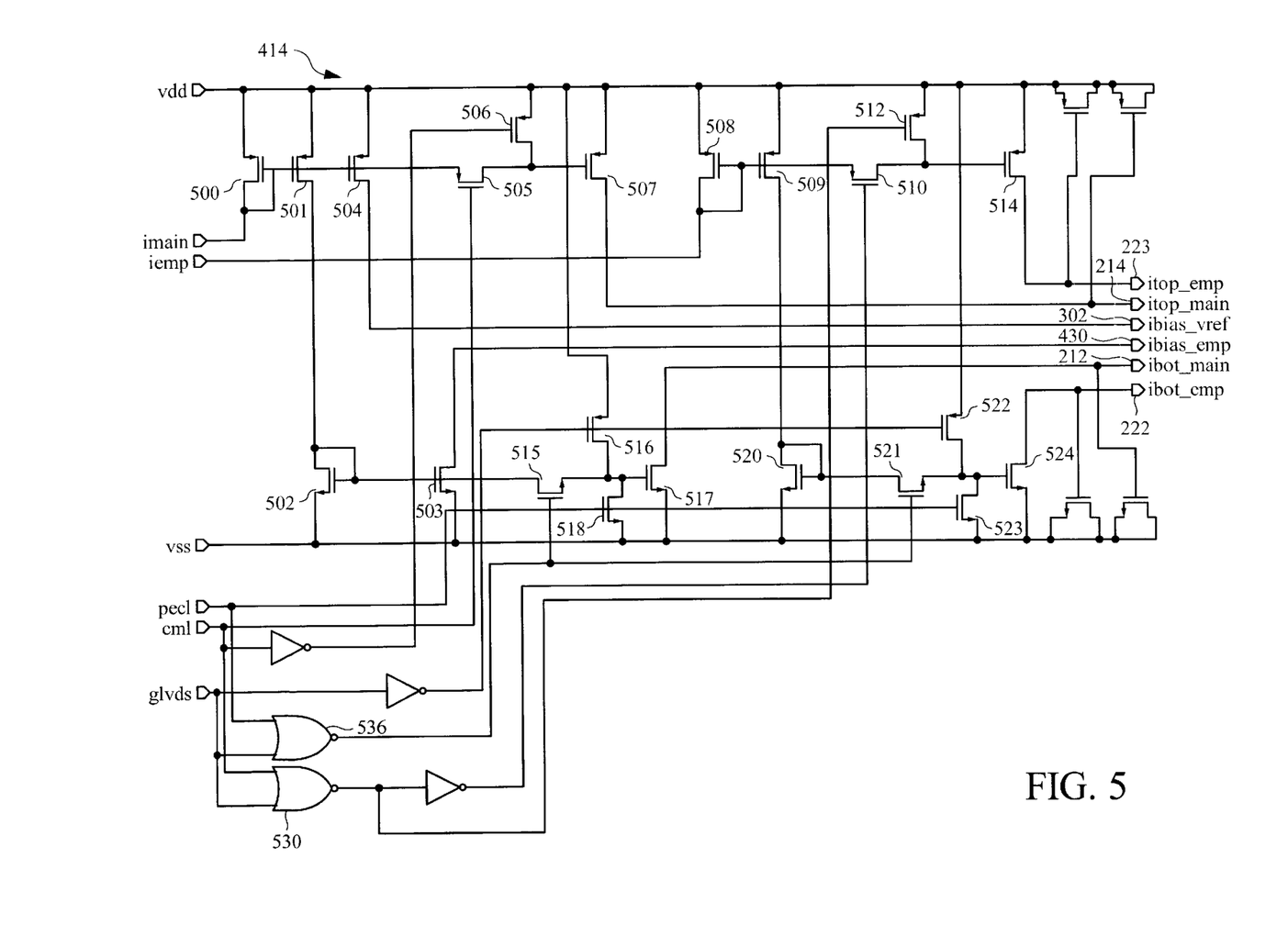
FIG. 5 is a schematic diagram of one embodiment of a main bias mirror and control of the driver bias circuit of FIG. 4.

FIG. 5 is a schematic diagram of one embodiment of the main bias mirror and control 414. As explained, the main bias mirror and control provides the bias currents for the main driver transistors, as well as controlling the emphasis for the different driver configurations.

In operation, the main bias current 422 from DAC 420 is coupled to transistor 500. This current is mirrored to transistors 501, 502 and 503 to provide the input current for DAC 402. Thus, DAC 402 receives the same main reference current as main bias mirror and control 414. The emphasis bias current from DAC 402 is coupled to transistor 508 and mirrored to transistors 509 and 520. The remaining output currents are selected based upon the desired operating mode, see Tables 1 and 2.

If the PECL mode is selected, n-channel transistor 518 is activated to turn transistor 517 off. As such, node 212 (main driver bottom bias) is floating, or open. Likewise, n-channel transistor 523 is activated to turn transistor 524 off to open circuit node 222 (emphasis bottom bias). P-channel transistor 505 is activated and p-channel transistor 506 is deactivated when the CML mode is not selected. As such, the main bias current is mirrored to transistor 507 and output 214 (driver top bias). In a similar manner, p-channel transistor 510 is activated and p-channel transistor 512 is deactivated. Thus, transistor 514 mirrors the emphasis bias to node 223 (emphasis top bias).

If the CML mode is selected, transistor 505 is turned OFF and transistor 506 is turned ON to turn OFF transistor 507 and open circuit output 214. Likewise, p-channel transistor 510 is turned OFF and p-channel transistor 512 is turned ON to turn OFF transistor 514 and open circuit output 223. That is, NOR gate 530 has a low output signal when CML is selected. The output of NOR gate 536 is high during PCL operation which activates n-channel transistor 521 to couple the emphasis current to transistor 524 and output 222. Likewise, NOR 536 activates n-channel transistor 515 to couple the emphasis current to transistor 517 and output 212.

If the GLVDS mode is selected, p-channel transistors 516 and 522 are activated. This activates transistors 517 and 524 to short circuit output nodes 212 and 222, respectively, to Vss. NOR gate 530 activates transistor 510 and deactivates transistor 512. As such, the emphasis current is coupled to output 223. With the CML signal low, transistor 505 is turned ON and transistor 506 is turned OFF to couple the bias current to output 214.

In the LVDS mode, transistors 505 and 510 are activated and transistors 506 and 512 are deactivated. Thus, the bias current and the emphasis current are coupled to outputs 214 and 233, respectively. Likewise, transistors 515 and 521 are activated and transistors 518 and 523 are deactivated. Thus, the bias current and the emphasis current are coupled to outputs 212 and 222, respectively. Further, the termination transistor 224 and 226 are activated during the LVDS mode in response to decoder 408, see FIGS. 2 and 4.

Conclusion

An integrated circuit output driver has been described. The driver can operate in a mode selected from a group of possible modes. The described driver can operate in different driver modes, such as, but not limited to, a positive emitter coupled logic (PECL), a current mode logic (CML), a grounded low voltage differential signal (GLVDS), or a low voltage differential signal (LVDS) mode. The driver circuit includes a output driver, an emphasis circuit and termination circuitry. A driver bias circuit controls the bias currents for the output driver and the emphasis circuit. The driver bias circuit is controlled to select the desire driver mode. A termination circuitry can be activated based upon the selected mode.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
    a control circuit to select a data communication mode;
    a differential output driver circuit adapted to drive data on first and second external connections based on a selected data communication mode, wherein the selected data communication mode is selected from a group comprising PECL, LVDS, GLVDS, and CML, and wherein the differential output driver circuit comprises a driver circuit having first and second pull-up transistors coupled in series with first and second pull-down transistors, the pull-up transistors are coupled to a pull-up bias node and the pull-down transistors are coupled to a pull-down bias node; and
    a bias circuit coupled to the pull-up and pull-down bias nodes to provide bias currents based upon the selected data communication mode.

2. The integrated circuit of claim 1 further comprising termination circuitry selectively coupled to the external connections based upon the selected data communication mode.

3. The integrated circuit of claim 2 wherein the termination circuitry comprises termination resistance coupled between the first and second external connections, respectively, and a termination voltage bias node.

4. The integrated circuit of claim 3 further comprising a reference voltage circuit coupled to the termination voltage bias node to provide a termination bias voltage.

5. The integrated circuit of claim 1 wherein the control circuit comprises a digital to analog converter (DAC) to receive digital selection signals and provide bias currents to the differential output driver circuit in response to the digital selection signals.

6. An integrated circuit comprising:
    a control circuit to select a data communication mode;
    a differential output driver circuit adapted to drive data on first and second external connections based on a selected data communication mode, wherein the selected data communication mode is selected from a group comprising PECL, LVDS, GLVDS, and CML; and
    a differential emphasis circuit coupled to the first and second external connections.

7. The integrated circuit of claim 6 wherein the differential emphasis circuit comprises first and second pull-up transistors coupled in series with first and second pull-down transistors, the pull-up transistors are coupled to a pull-up emphasis bias node and the pull-down transistors are coupled to a pull-down emphasis bias node.

8. An output driver circuit comprising:
    a first pull-up transistor coupled in series with a first pull-down transistor between a pull-up bias node and a pull-down bias node, gates of the first pull-up and first pull-down transistors are coupled to receive a first input data signal, and a common node between the first pull-up and first pull-down transistors is coupled to a first output data node;
    a second pull-up transistor coupled in series with a second pull-down transistor between the pull-up bias node and the pull-down bias node, gates of the second pull-up and second pull-down transistors are coupled to receive a second input data signal, and a common node between the second pull-up and second pull-down transistors is coupled to a second output data node; and a control circuit coupled to provide a pull-up bias current to the pull-up bias node, and provide a pull-down bias current to the pull-down bias node, wherein the bias currents are selected based upon a data communication mode selected from a group comprising PECL, LVDS, GLVDS, and CML.

9. The output driver circuit of claim 8 further comprises an emphasis circuit comprising:

a third pull-up transistor coupled in series with a third pull-down transistor between a pull-up emphasis bias node and a pull-down emphasis bias node, gates of the third pull-up and third pull-down transistors are coupled to receive a first emphasis input data signal, and a common node between the third pull-up and third pull-down transistors is coupled to the first output data node; and a fourth pull-up transistor coupled in series with a fourth pull-down transistor between the pull-up emphasis bias node and the pull-down emphasis bias node, gates of the fourth pull-up and fourth pull-down transistors are coupled to receive a second emphasis input data signal, and a common node between the fourth pull-up and fourth pull-down transistors is coupled to the second output data node, wherein the control circuit is coupled to provide a pull-up emphasis bias current to the pull-up emphasis bias node, and provide a pull-down emphasis bias current to the pull-down emphasis bias node, wherein the emphasis bias currents are selected based upon the data communication mode selected from the group comprising PECL, LVDS, GLVDS, and CML.

10. The output driver circuit of claim 9 wherein the control circuit comprises a digital to analog converter (DAC) to receive digital selection signals and generate the pull-up and pull-down emphasis bias currents.

11. The output driver circuit of claim 8 further comprising:

a first termination transistor coupled between the first output data node and a termination reference voltage node, a second termination transistor coupled between the second output data node and the termination reference voltage node; and a reference circuit to provide a reference voltage to the termination reference voltage node.

12. The output driver circuit of claim 8 wherein the control circuit comprises a digital to analog converter (DAC) to receive digital selection signals and generate the pull-up and pull-down bias currents.

13. The output driver circuit of claim 12 wherein the control circuit further comprises a decoder to control the DAC based upon the data communication mode selected from the group comprising PECL, LVDS, GLVDS, and CML.

14. An output driver circuit comprising:

a first pull-up transistor coupled in series with a first pull-down transistor between a pull-up bias node and a pull-down bias node, gates of the first pull-up and first pull-down transistors are coupled to receive a first input data signal, and a common node between the first pull-up and first pull-down transistors is coupled to a first output data node;

a second pull-up transistor coupled in series with a second pull-down transistor between the pull-up bias node and the pull-down bias node, gates of the second pull-up and second pull-down transistors are coupled to receive a second input data signal, and a common node between the second pull-up and second pull-down transistors is coupled to a second output data node;

a third pull-up transistor coupled in series with a third pull-down transistor between a pull-up emphasis bias node and a pull-down bias node, gates of the third pull-up and third pull-down transistors are coupled to receive a first emphasis input data signal, and a common node between the third pull-up and third pull-down transistors is coupled to the first output data node;

a fourth pull-up transistor coupled in series with a fourth pull-down transistor between the pull-up emphasis bias node and the pull-down emphasis bias node, gates of the fourth pull-up and fourth pull-down transistors are coupled to receive a second emphasis input data signal, and a common node between the fourth pull-up and fourth pull-down transistors is coupled to the second output data node; and a control circuit coupled to provide a pull-up bias current to the pull-up bias node, and provide a pull-down bias current to the pull-down bias node, wherein the bias currents are selected based upon a data communication mode selected from a group comprising PECL, LVDS, GLVDS, and CML, and wherein the control circuit is coupled to provide a pull-up emphasis bias current to the pull-up emphasis bias node, and provide a pull-down emphasis bias current to the pull-down emphasis bias node, wherein the emphasis bias currents are selected based on upon the selected data communication mode.

15. The output driver circuit of claim 14 wherein the control circuit comprises:

a digital to analog converter (DAC) to receive digital selection signals and generate the pull-up and pull-down bias currents, and the pull-up and pull-down emphasis bias currents; and a decoder to control the DAC based upon the data communication mode selected from the group comprising PECL, LVDS, GLVDS, and CML.

16. The output driver circuit of claim 14 further comprising:

a first termination transistor coupled between the first output data node and a termination reference voltage node, a second termination transistor coupled between the second output data node and the termination reference voltage node; and a reference circuit to provide a reference voltage to the termination reference voltage node.

17. An output driver circuit comprising:

a first p-channel pull-up transistor coupled in series with a first n-channel pull-down transistor between a pull-up bias node and a pull-down bias node, gates of the first p-channel pull-up and first n-channel pull-down transistors are coupled to receive a first input data signal, and a common node between the first p-channel pull-up and first n-channel pull-down transistors is coupled to the first output data node;

a second p-channel pull-up transistor coupled in series with a second n-channel pull-down transistor between the pull-up bias node and the pull-down bias node, gates of the second p-channel pull-up and second n-channel pull-down transistors are coupled to receive a second input data signal, and a common node between the second p-channel pull-up and second n-channel pull-down transistors is coupled to a second output data node; and a control circuit coupled to provide a pull-up bias current to the pull-up bias node, and provide a pull-down bias current to the pull-down bias node, wherein the bias currents are selected based upon a data communication mode selected from a group comprising PECL, LVDS, GLVDS, and CML.

18. The output driver circuit of claim 17 further comprises an emphasis circuit comprising:

a third p-channel pull-up transistor coupled in series with a third n-channel pull-down transistor between a pull-up emphasis bias node and a pull-down emphasis bias node, gates of the third p-channel pull-up and third n-channel pull-down transistors are coupled to receive a first emphasis input data signal, and a common node between the third p-channel pull-up and third n-channel pull-down transistors is coupled to the first output data node; and a fourth p-channel pull-up transistor coupled in series with a fourth n-channel pull-down transistor between the pull-up emphasis bias node and the pull-down emphasis bias node, gates of the fourth p-channel pull-up and fourth n-channel pull-down transistors are coupled to receive a second emphasis input data signal, and a common node between the fourth p-channel pull-up and fourth n-channel pull-down transistors is coupled to the second output data node, wherein the control circuit is coupled to provide a pull-up emphasis bias current to the pull-up emphasis bias node, and provide a pull-down emphasis bias current to the pull-down emphasis bias node, wherein the emphasis bias currents are selected based upon the data communication mode selected from the group comprising PECL, LVDS, GLVDS, and CML.

19. The output driver circuit of claim 18 wherein the control circuit comprises a digital to analog converter (DAC) to receive digital selection signals and generate the pull-up and pull-down emphasis bias currents.

20. The output driver circuit of claim 17 further comprising:

a first termination transistor coupled between the first output data node and a termination reference voltage node, a second termination transistor coupled between the second output data node and the termination reference voltage node; and a reference circuit to provide a reference voltage to the termination reference voltage node.

21. The output driver circuit of claim 17 wherein the control circuit comprises a digital to analog converter (DAC) to receive digital selection signals and generate the pull-up and pull-down bias currents.

22. The output driver circuit of claim 21 wherein the control circuit further comprises a decoder to control the DAC based upon the data communication mode selected from the group comprising PECL, LVDS, GLVDS, and CML.

23. An integrated circuit comprising:

a differential output driver circuit adapted to drive data on first and second external connections based on a selected data communication mode, wherein the selected data communication mode is selected from a group comprising PECL, LVDS, GLVDS, and CML, the differential output driver circuit has a pull-up bias node and a pull-down bias node; and a control circuit coupled to the differential output driver circuit to provide pull-up and pull-down bias currents to the differential output driver circuit in response to the selection signals, wherein the pull-up bias node is coupled to a reference bias current during PECL, LVDS and GLVDS data communication modes and is coupled to an open circuit during the CML data communication mode, the pull-down bias node is coupled to the reference bias current during CML and LVDS data communication modes, is coupled to an open circuit during the PECL data communication mode and is coupled to ground during the GLVDS data communication mode.

24. A method of outputting data from an output driver circuit comprising:

selecting a data communication mode from either PECL, LVDS, GLVDS or CML; and providing bias currents to the output driver circuit based upon the selected data communication mode by selecting an output driver pull-up current and an output driver pull-down current based upon the selected data communication mode.

25. The method of claim 24 further comprises providing emphasis bias currents to a data emphasis circuit.

26. The method of claim 25 wherein providing the emphasis bias currents comprises selecting an emphasis pull-up current and an emphasis pull-down current based upon the selected data communication mode.

27. A method of outputting data from an output driver circuit comprising:

selecting a data communication mode from a group comprising PECL, LVDS, GLVDS or CML;

providing bias currents to the output driver circuit based upon the selected data communication mode; and providing emphasis bias currents to a data emphasis circuit.

28. The method of claim 27 wherein providing the emphasis bias currents comprises selecting an emphasis pull-up current and an emphasis pull-down current based upon the selected data communication mode.

29. An integrated circuit comprising:

a control circuit to select a data communication mode;

a differential output driver circuit adapted to drive data on first and second external connections based on a selected data communication mode, wherein the differential output driver circuit comprises a driver circuit having first and second pull-up transistors coupled in series with first and second pull-down transistors, the pull-up transistors are coupled to a pull-up bias node and the pull-down transistors are coupled to a pull-down bias node; and a bias circuit coupled to the pull-up and pull-down bias nodes to provide bias currents based upon the selected data communication mode.

30. The integrated circuit of claim 29 further comprising termination circuitry selectively coupled to the external connections based upon the selected data communication mode.

31. The integrated circuit of claim 30 wherein the termination circuitry comprises termination resistance coupled between the first and second external connections, respectively, and a termination voltage bias node.

* * * * *